US007982684B2

(12) United States Patent
O'Connell et al.

(10) Patent No.: US 7,982,684 B2
(45) Date of Patent: Jul. 19, 2011

(54) METHOD AND STRUCTURE FOR RF ANTENNA MODULE

(75) Inventors: John B. O'Connell, Seattle, WA (US);
Peter T. Heisen, Kent, WA (US);
Stephen L. Fahley, Renton, WA (US);
Richard N. Bostwick, North Bend, WA (US); Julio A. Navarro, Kent, WA (US)

(73) Assignee: The Boeing Company, Chicago, IL (US)

( * ) Notice: Subject to any disclaimer, the term of this patent is extended or adjusted under 35 U.S.C. 154(b) by 157 days.

(21) Appl. No.: 11/567,692

(22) Filed: Dec. 6, 2006

(65) Prior Publication Data
US 2008/0136732 A1 Jun. 12, 2008

(51) Int. Cl.
*H01Q 1/42* (2006.01)
(52) U.S. Cl. ....................................................... 343/872
(58) Field of Classification Search ........... 343/700 MS, 343/873, 872; 29/600, 601; 361/704, 707, 361/709, 719, 720; 333/204, 246; 156/60
See application file for complete search history.

(56) References Cited

U.S. PATENT DOCUMENTS

| | | | |
|---|---|---|---|
| 4,628,407 A * | 12/1986 | August et al. | 361/711 |
| 5,502,889 A | 4/1996 | Casson et al. | |
| 5,671,525 A | 9/1997 | Fidalgo | |
| 5,688,584 A | 11/1997 | Casson et al. | |
| 6,020,848 A | 2/2000 | Wallace et al. | 342/362 |
| 6,137,377 A | 10/2000 | Wallace et al. | 333/139 |
| 6,137,693 A | 10/2000 | Schwiebert et al. | |
| 6,195,047 B1 | 2/2001 | Richards | |
| 6,271,728 B1 | 8/2001 | Wallace et al. | 330/286 |
| 6,320,543 B1 | 11/2001 | Ohata et al. | |
| 6,388,636 B1 | 5/2002 | Brown et al. | |
| 6,538,312 B1 | 3/2003 | Peterson et al. | |
| 6,625,028 B1 | 9/2003 | Dove et al. | |
| 6,686,656 B1 | 2/2004 | Koh et al. | |
| 6,815,739 B2 * | 11/2004 | Huff et al. | 257/275 |
| 6,910,636 B2 | 6/2005 | Kim et al. | |
| 7,045,440 B2 | 5/2006 | Huff et al. | |
| 7,168,152 B1 | 1/2007 | Ehret et al. | |
| 7,388,756 B1 | 6/2008 | Worl et al. | |
| 7,444,737 B2 | 11/2008 | Worl | |
| 2003/0100197 A1 | 5/2003 | Veitschegger et al. | |
| 2004/0004819 A1 * | 1/2004 | Wong | 361/707 |
| 2007/0273008 A1 * | 11/2007 | Suzuki | 257/659 |

FOREIGN PATENT DOCUMENTS

| | | |
|---|---|---|
| EP | 1775765 A1 | 4/2007 |
| WO | 2006001389 A1 | 1/2006 |

OTHER PUBLICATIONS

Extended EP Search Report dated Aug. 6, 2009, pp. 1-7.

* cited by examiner

*Primary Examiner* — Jacob Y Choi
*Assistant Examiner* — Robert Karacsony
(74) *Attorney, Agent, or Firm* — Yee & Associates. P.C.

(57) ABSTRACT

Method and structure for a microwave antenna module is provided. The method includes, creating a laminate structure by laminating a plurality of conductive layers and dielectric layers; creating a plurality of layers within the laminate structure to interconnect the plurality of conductive layers and dielectric layers; laminating a base plate to a bottom of the laminate structure; wherein the baseplate operates as a heat sink; and laminating a seal ring to a top periphery of the laminate structure.

16 Claims, 5 Drawing Sheets

METHOD AND STRUCTURE FOR RF ANTENNA MODULE

CROSS REFERENCE TO RELATED APPLICATIONS

NONE

BACKGROUND

1. Field of the Disclosure

This disclosure is directed to chip modules and more particularly, to an antenna module using a laminate structure.

2. Related Art

Microwave antenna systems place tough demands on packaging design. Scanning requirements of an antenna beam demand that radiating elements be closely spaced. Furthermore, often electronic components may not fit within an available space in an XY plane and may need to be aligned in a Z plane. Therefore, electronic components are packaged in modules, usually arranged to form a compact three-dimensional assembly.

Conventional microwave modules are built from ceramic dielectric materials, including Alumina, Ferro A6, and Dupont 943. The ceramic materials are expensive and require long manufacturing lead times.

Therefore, there is need for a structure and method for producing low cost RF microwave antenna modules.

SUMMARY OF THE DISCLOSURE

In one aspect, a method of manufacturing a microwave antenna module is provided. The method includes, creating a laminate structure by laminating a plurality of conductive layers and dielectric layers; creating a plurality of vias within the laminate structure to interconnect the plurality of conductive layers and dielectric layers; laminating a base plate to a first side of the laminate structure; wherein the baseplate operates as a heat sink; and laminating a seal ring to a periphery of a second side of the laminate structure.

In another aspect, a structure for an antenna module is provided. The structure includes a laminate structure fabricated by laminating a plurality of conductive layers and dielectric layers; wherein a plurality of vias within the laminate structure interconnects the plurality of conductive layers and the dielectric layers; and the laminate structure includes an interconnect network, and a plurality of plated cutouts extending from a first side of the laminate structure to a second side of the laminate structure; a base plate laminated to the second side of the laminate structure; wherein the baseplate operates as a heat sink; a seal ring attached to a periphery of the first side of laminate structure; and a plurality of conductive standoffs disposed inside the cutouts and elevates a component to the first side of the laminate structure and provides heat conduction between the component and the baseplate.

This brief summary has been provided so that the nature of the disclosure may be understood quickly. A more complete understanding of the disclosure may be obtained by reference to the following detailed description of embodiments, thereof in connection with the attached drawings.

BRIEF DESCRIPTION OF THE DRAWINGS

The foregoing features and other features of the present disclosure will now be described with reference to the drawings. In the drawings, the same components have the same reference numerals. The illustrated embodiment is intended to illustrate, but not to limit the disclosure. The drawings include the following figures.

DETAILED DESCRIPTION

Definitions

The following definitions are provided as they are typically (but not exclusively) used in relation to printed wiring board technology, referred to by various aspects of the present disclosure.

"Stackup" means an arrangement where various layers are stacked to for a multi-layer laminate structure or board.

"Blind via" means a via, which is visible only on one surface of a printed circuit board.

"Prepreg" means a pre-impregnated composite fiber that contains resin and is used to bond laminates together.

To facilitate an understanding of the preferred embodiment, the general architecture and process of making interconnects will be described. The specific architecture and process of the preferred embodiment will then be described with reference to the general architecture and process.

In one aspect, a low cost RF antenna module 100 (hereinafter "module 100") is provided. Module 100 packages monolithic microwave integrated circuits (MMICs) (for example, 112 FIG. 1A), application specific integrated circuits (ASICs) (for example, 106, FIG. 1A), and discrete components like capacitors (for example, 104, FIG. 1A), resistors (for example, 108, FIG. 1A) and ferrite circulators (for example, 115, FIG. 1A). Module 100 provides a network for interconnecting these components; and input and output (I/O) terminals for microwave, data and clock signals.

Module 100 may be constructed by laminating copper backed microwave laminate materials to replace high cost ceramic materials. Dielectric constant of the laminate material is higher than normally used in printed circuit boards because high dielectric constant provides compact structures that are useful in compact antenna structures where signal wavelengths are becoming shorter.

Figure 1A:
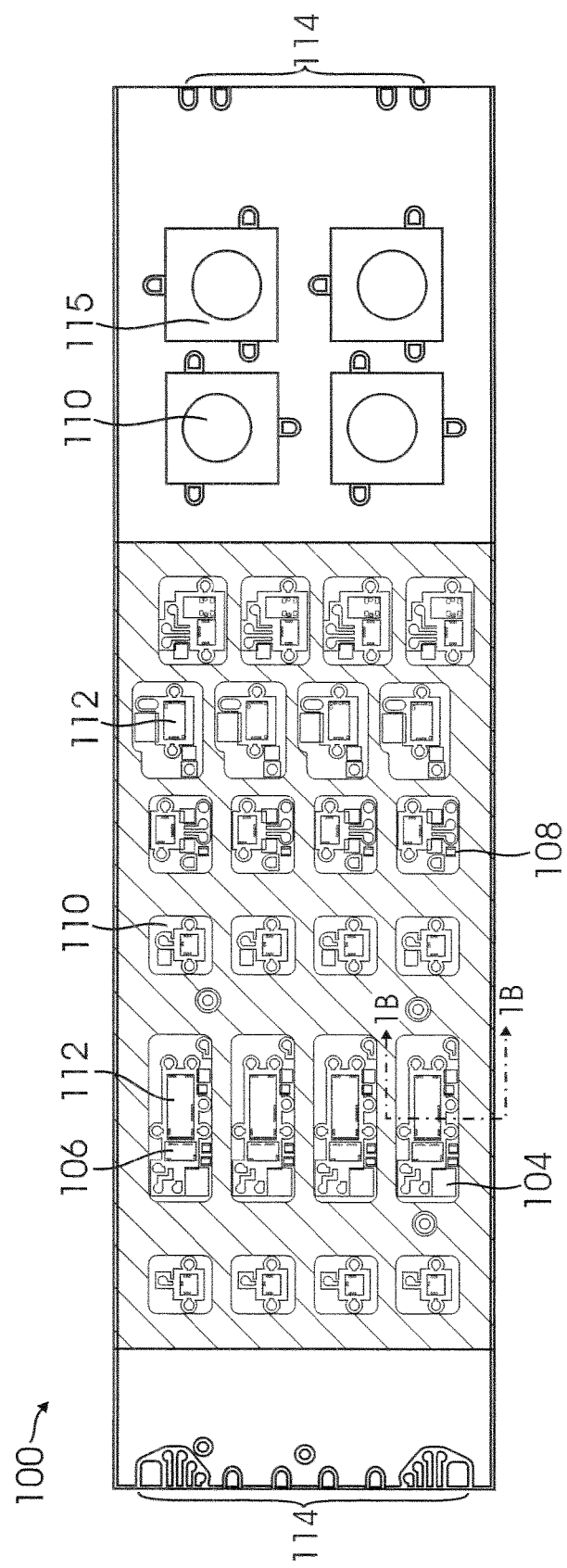
FIG. 1A shows a top view of an RF antenna module using laminate structure of an embodiment.
Figure 1B:
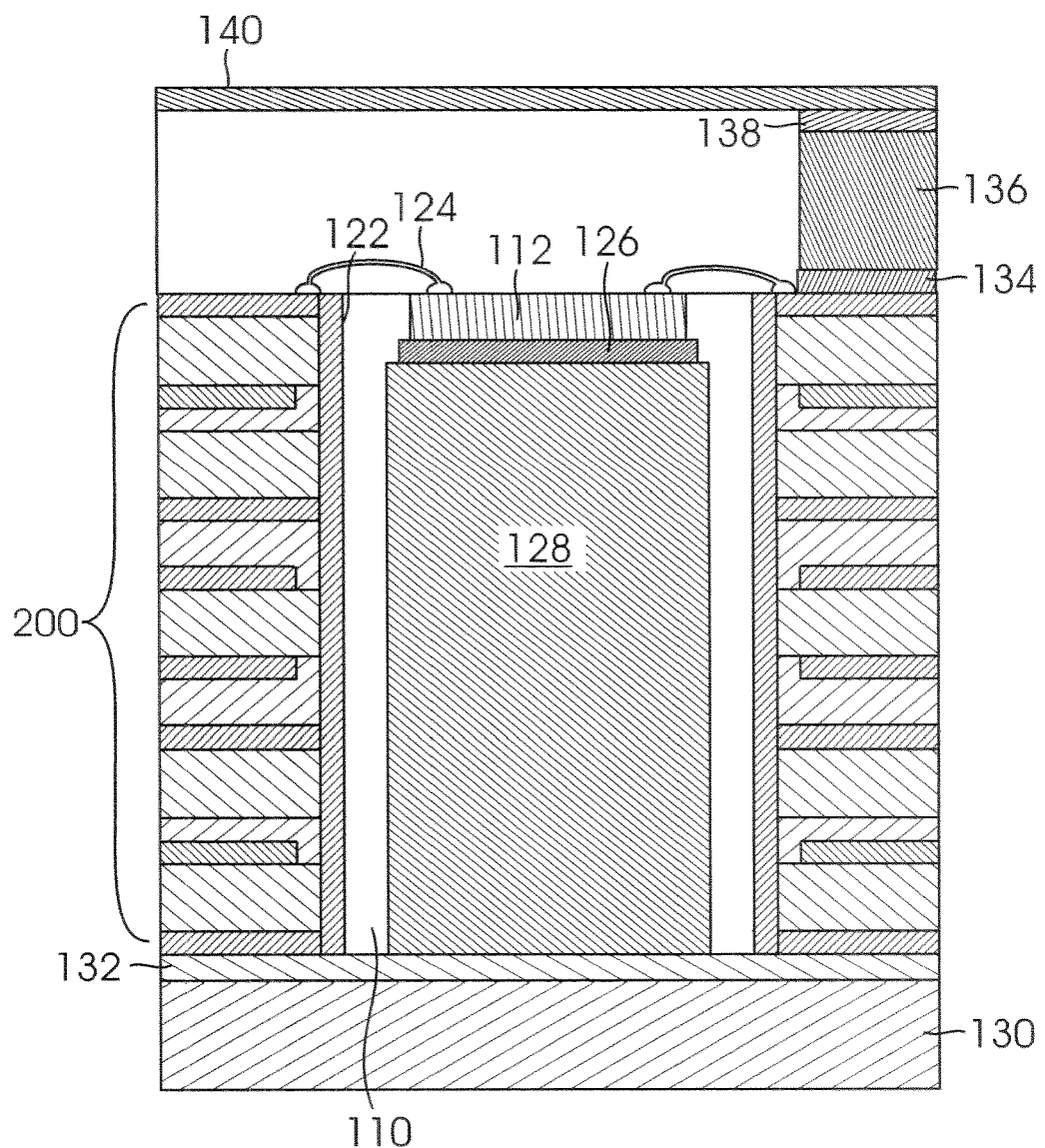
FIG. 1B shows a cross section of the RF antenna module of FIG. 1A.

FIG. 1A shows a top view of module 100. Plurality of RF components 104, 106, 108 and 112 are attached to a top side of a laminate structure (for example, 200, FIG. 1B) (hereinafter "PCB 200")) or onto thermally conductive standoffs (for example, 128, FIG. 1B) (hereinafter "standoff 128". A detailed structure of module 100 is shown in FIG. 1B that is described below.

Module 100 includes PCB 200 that is placed between a baseplate 130 and a seal ring 136. Plurality of cutouts 110 extend from a top side through a bottom side of PCB 200. Cutouts Walls of the cutouts 110 are copper plated (shown as 122), which enhances PCB 200 grounding. Baseplate 130 is attached to a bottom side of PCB 200, for example, by using adhesive 132. Baseplate 130 operates as heatsink for module 100.

Standoffs 128 are disposed in cutouts 110 and are attached to baseplate 130, for example, by using adhesive 132. Standoffs 128 elevate thermally sensitive ASICs 106, and MMICs 112, to a top side of PCB 200 and provide heat conduction between these components and baseplate 130.

ASICs 106 and MMICs 112 may be attached to standoff 128, for example, by using adhesive 126, and are electrically connected to PCB 200 via wirebonds 124.

Seal ring 136 is attached to PCB 200 around a periphery of PCB 200, for example, by using adhesive 134. Lid 140 is attached to seal ring 136, for example, by using adhesive 138. Lid 140 is used to seal module 100.

Figure 2:
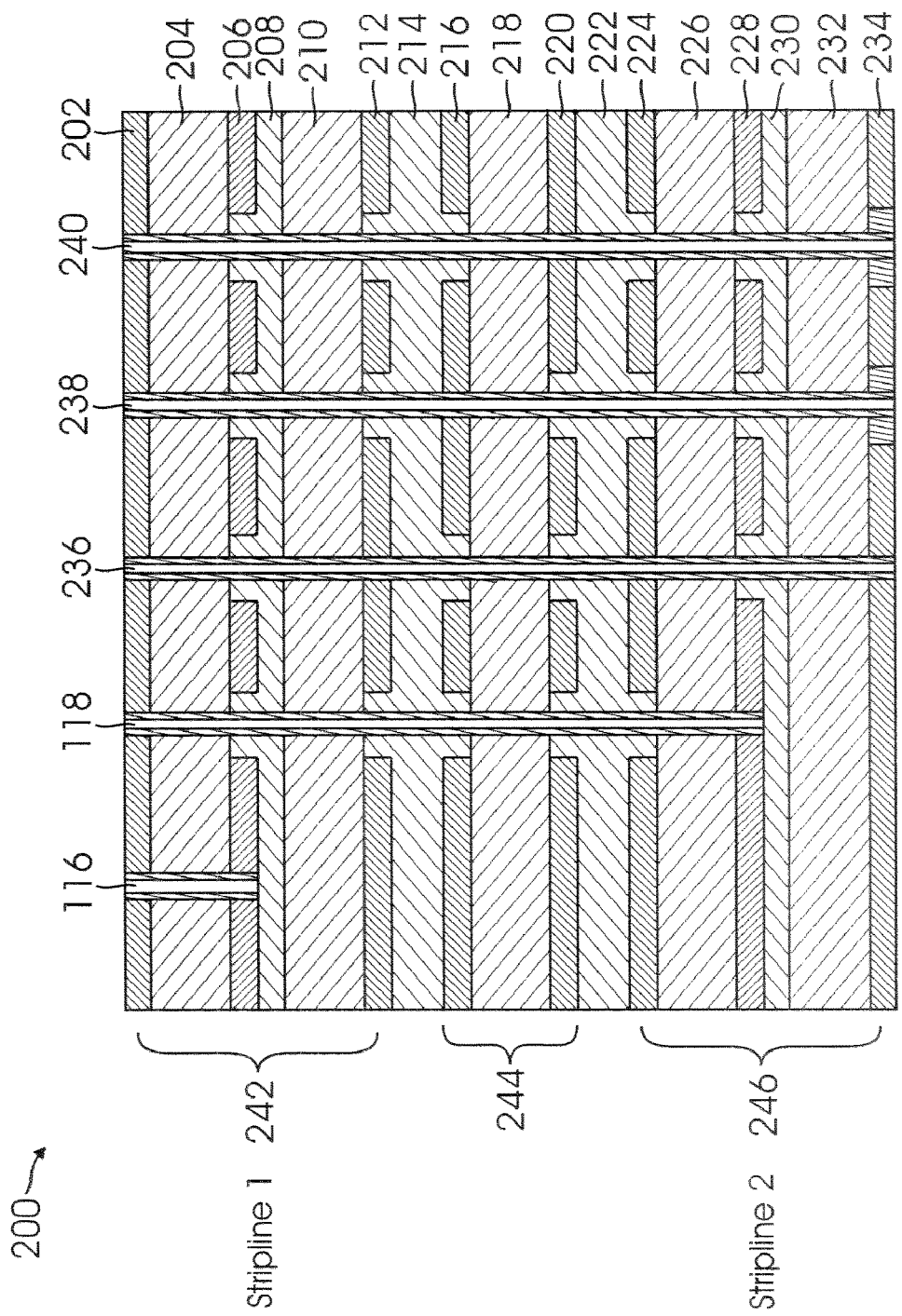
FIG. 2 illustrates a laminate structure used in the RF antenna module of an embodiment.

FIG. 2 shows a laminate layered structure (or stackup) for PCB 200, which includes stripline structures, 242 and 246. Structure 244 is placed between striplines 242 and 246 for clock, data and DC supply distribution. A plurality of vias 116, 118, 236, 238 and 240 are distributed along PCB 200 for connecting plural metal layers.

Stripline1 242 includes, dielectric layer 204, interposed between metal layer 202 and metal layer 206. Prepreg layer 208 bonds metal layer 206 to dielectric layer 210, which is interposed between adhesive layer 208 and metal layer 212.

Stripline2 246 includes, dielectric layer 226 interposed between metal layer 224 and metal layer 228. Prepreg layer 230 bonds metal layer 228 to dielectric layer 232. Dielectric layer 232 is interposed between layer 230 and layer 234.

Double-sided structure 244 includes, dielectric layer 218, interposed between metal layer 216 and metal layer 220. Prepreg layers 214 and 222 bond structure 244 to striplines 242 and 246, respectively.

Blind via 116 connects metal layer (a first "RF signal layer") 206 to metal layer 202; while blind via 118 connects metal layer (a "second RF signal layer") 228 to metal layer 202.

Via 236 and plated cutout 110 (with plating 122, as shown in FIG. 1B) connect ground plane metal layers 202, 212, 224 and 234 to provide a robust grounding scheme for PCB 200.

Via 238 connect metal layer 202 to "DC, data1 and clock layer" metal layer 216 and metal layer 228. Blind via 240 connects metal layer 202 to "DC, data2 and clock layer" metal layer 216 and "RF signal layers" metal layer 206 and 228.

Figure 3:
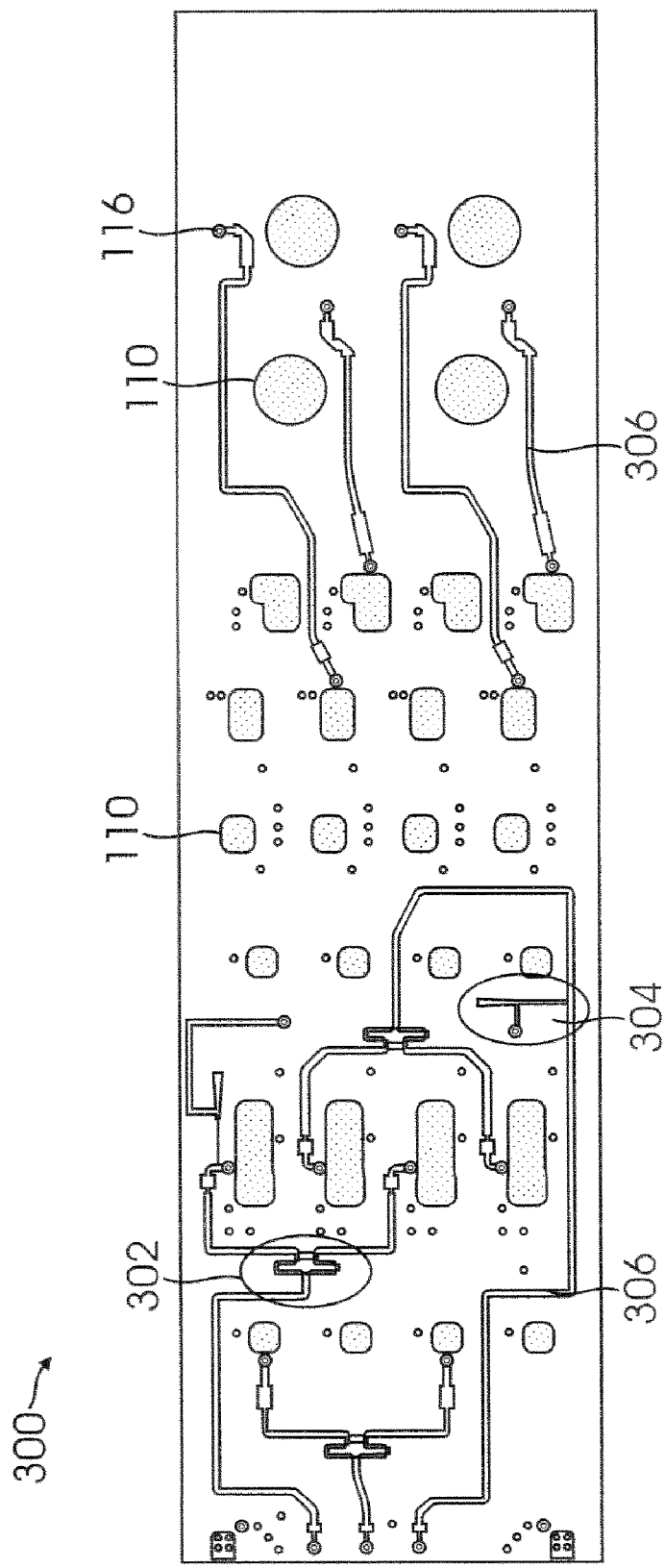
FIG. 3 shows a typical RF signal layer of a low cost RF antenna module of an embodiment.

FIG. 3 shows an interconnect pattern 300 of a typical RF signal layer based on module 100. Interconnect pattern includes; structures like Wilkinson splitters 302, which are used in microwave signal paths as a splitter or combiner of RF signals; half wavelength stubs 304 that separate control signals from microwave signals; and controlled length signal lines 306.

Figure 4:
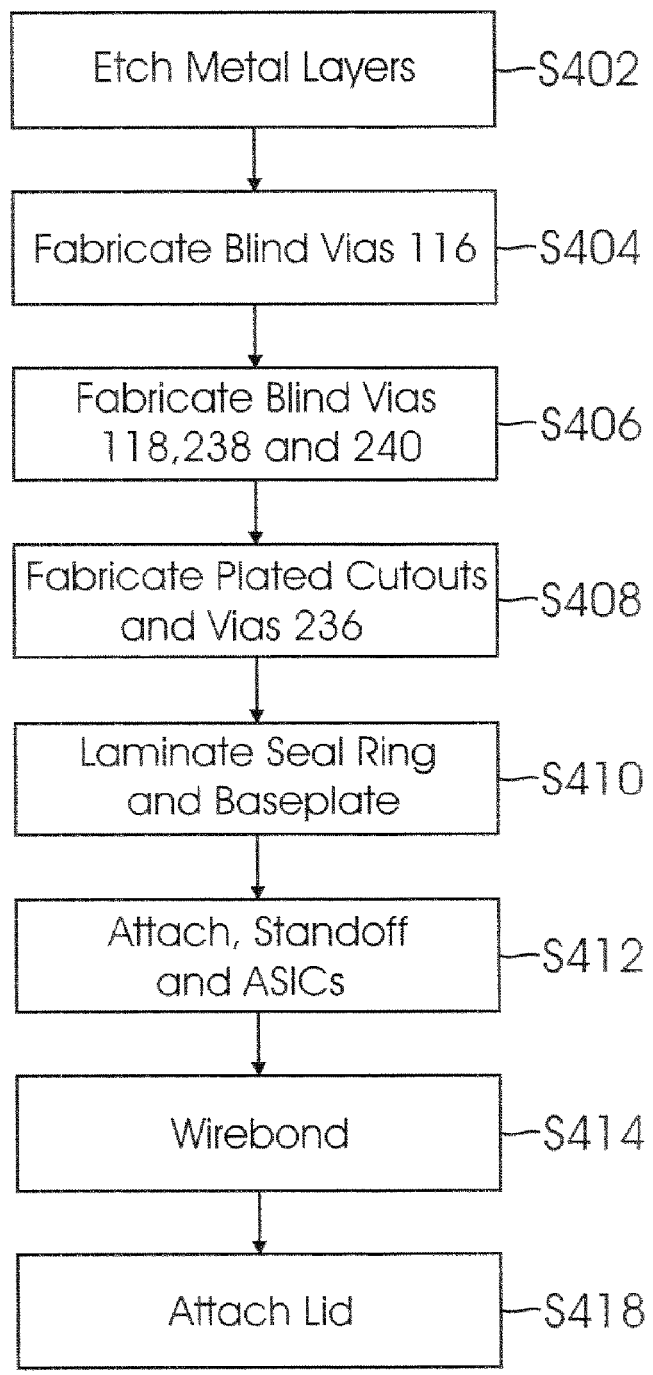
FIG. 4 is a flowchart of a process for manufacturing a RF antenna module, according to an embodiment.

FIG. 4 shows a flowchart, illustrating method 400 for producing module 100, according to one aspect of the present disclosure.

The process starts in step S402, when metal layers 202, 206, 212 216, 220, 224, 228, and 234 are etched. In step S404, layer 202 and 206 are drilled and plated, creating blind vias 116.

In step S406, layers 202, 206, 212, 216, 220, 224, and 228, are laminated, drilled and plated, creating blind vias 118, 238 and 240.

In step S408, layer 234 is laminated to layer 228, cutouts 110 are routed, layers 202, 206, 212, 216, 220, 224, 228, and 234 are drilled. Then the whole assembly is plated, creating PCB 200 with through vias 236 and plated cutouts 110.

In step S410, a seal ring 136 is laminated to layer 202 and a baseplate 130 is laminated to layer 234. After lamination, PCB 200 is routed creating individual modules 100.

In step S412, standoffs 128 are attached to baseplate 130; components 104 and 108 are attached to layer 202; and ASICs 106 and MMICs 112 are attached to standoff 128.

In step S414, ASICs and MMICs are wirebonded to layer 202, creating a populated module 100. Thereafter, in step S416, lid 140 is attached to seal ring 136 to complete the assembly process of RF antenna module 100.

In one aspect, the foregoing approach is advantageous because it allows manufacture of high performance RF antenna modules faster and cheaper without ceramic packaging.

Although the present disclosure has been described with reference to specific embodiments, these embodiments are illustrative only and not limiting. Many other applications and embodiments of the present disclosure will be apparent in light of this disclosure and the following claims.

What is claimed is:

1. A method of manufacturing a microwave antenna module, comprising:

creating a laminate structure with a top side and a bottom side, by laminating a plurality of conductive layers and dielectric layers between the top side and the bottom side, wherein creating the laminate structure further comprises:

forming a first stripline having a first metal layer, a third metal layer, and a second metal layer suspended between the first metal layer and the third metal layer by a first dielectric and adhesive layer, wherein the first metal layer and the third metal layer are ground planes connected by a first via to a plating, to a fourth metal layer and to a sixth metal layer, and wherein the second metal layer is a first radio frequency signal layer;

forming a second stripline having the fourth metal layer, the sixth metal layer, and a fifth metal layer suspended between the fourth metal layer and the sixth metal layer by a second dielectric and adhesive layer, wherein the fourth metal layer and the sixth metal layer are ground planes connected by the first via to the plating and the fifth metal layer is a second radio frequency signal layer;

forming a seventh metal layer and an eighth metal layer, with a third dielectric layer interposed between the seventh metal layer and the eighth metal layer, wherein the seventh metal layer is a first data layer, and the eighth metal layer is a second data layer, wherein the first metal layer is the top side of the laminate structure and the fourth metal layer is the bottom side of the laminate structure;

connecting the first metal layer to the seventh metal layer by a second via;

connecting the first metal layer to the eighth metal layer by a third via;

connecting the second metal layer to the first metal layer by a first blind via;

connecting the fifth metal layer to the first metal layer by a second blind via;

affixing the seventh metal layer to the third metal layer by a first prepreg layer; and affixing the eighth metal layer to the sixth metal layer by a second prepreg layer;

creating a cutout in the laminate structure, the cutout having a plurality of walls extending from the top side to the bottom side of the laminate structure;

plating the plurality of walls of the cutout extending from the top side to the bottom side and grounding the plated walls of the cutout;

laminating a base plate to the bottom side of the laminate structure, wherein the baseplate operates as a heat sink;

disposing a standoff in the cutout and attaching the standoff to the baseplate;

attaching a component to the standoff so as to substantially dispose the component in the cutout and elevate the component to the top side of the laminate structure; and laminating a seal ring to a periphery of the top side of the laminate structure.

2. The method of claim 1, further including coupling one or more of the conductive layers of the laminate structure to the plated wall of the cutout.

3. The method of claim 1, wherein the standoff is attached by using an adhesive.

4. The method of claim 1, wherein the component is an application specific integrated circuit.

5. The method of claim 1, wherein the component is a microwave integrated circuit.

6. The method of claim 1, wherein the seal ring is attached to the laminate structure using an adhesive.

7. The method of claim 1, further including wire bonding the component to the conductive layer of the laminate structure.

8. The method of claim 1, further including disposing a lid over the seal ring to seal the antenna module.

9. The method of claim 1 further comprising:
wherein the first data layer further comprises a first direct current layer and a first clock data layer; and
wherein the second data layer further comprises a second direct current layer and a second clock data layer.

10. A structure for a microwave antenna module comprising:
a laminate structure with a top side and a bottom side, fabricated by laminating a plurality of conductive layers and dielectric layers between the top side and the bottom side wherein the laminate structure further comprises:
a first stripline having a first metal layer, a third metal layer, and a second metal layer suspended between the first metal layer and the third metal layer by a first dielectric and adhesive layer, wherein the first metal layer and the third metal layer are ground planes connected by a first via to a plating, to a fourth metal layer and to a sixth metal layer, and wherein the second metal layer is a first radio frequency signal layer;
a second stripline having the fourth metal layer, the sixth metal layer, and a fifth metal layer suspended between the fourth metal layer and the sixth metal layer by a second dielectric and adhesive layer, wherein the fourth metal layer and the sixth metal layer are ground planes connected by the first via to the plating and the fifth metal layer is a second radio frequency signal layer;
a seventh metal layer and an eighth metal layer;
a third dielectric layer interposed between the seventh metal layer and the eighth metal layer, wherein the seventh metal layer is a first data layer, and the eighth metal layer is a second data layer, wherein the first metal layer is a top side of the microwave antennae module and the fourth metal layer is a bottom side of the microwave antennae module;
a seventh metal layer and an eighth metal layer, with a third dielectric layer interposed between the seventh metal layer and the eighth metal layer, wherein the seventh metal layer is a first data layer, and the eighth metal layer is a second data layer;
a first prepreg layer affixing the seventh metal layer to the third metal layer;
a second prepreg layer affixing the eighth metal layer to the sixth metal layer;
a second via connecting the first metal layer to the seventh metal layer;
a third via connecting the first metal layer to the eighth metal layer;
a first blind via connecting the second metal layer to the first metal layer;
a second blind via connecting the fifth metal layer to the first metal layer;
a base plate laminated to the bottom side of the laminate structure;
a seal ring attached to a periphery of the top side of laminate structure;
a conductive standoff disposed inside the cutout and attached to the base plate;
a component attached to the conductive standoff and substantially disposed in the cutout and elevated to the top side of the laminate structure; and
wherein the base plate operates as a heat sink;
wherein the standoff provides heat conduction between the component and the base plate;
wherein the second metal layer is a first radio frequency signal layer; and
wherein the first metal layer is the top side of the laminate structure and the fourth metal layer is the bottom side of the laminate structure.

11. The structure of claim 10, wherein the standoff is attached by using an adhesive.

12. The structure of claim 10, wherein the component is an application specific integrated circuit.

13. The structure of claim 10, wherein the component is a microwave integrated circuit.

14. The structure of claim 10, wherein the seal ring is attached to the laminate structure using an adhesive.

15. The structure of claim 10, wherein a wire bond couples the component to the conductive layer of the laminate structure.

16. The structure of claim 10, wherein a lid is disposed over the seal ring to seal the antenna module.

* * * * *